(12) United States Patent
Brandman (10) Patent No.: US 8,001,441 B2
(45) Date of Patent: Aug. 16, 2011

(54) NONVOLATILE MEMORY WITH MODULATED ERROR CORRECTION CODING

(75) Inventor: Yigal Brandman, Los Altos Hills, CA (US)

(73) Assignee: SanDisk Technologies Inc., Plano, TX (US)

( * ) Notice: Subject to any disclaimer, the term of this patent is extended or adjusted under 35 U.S.C. 154(b) by 1321 days.

(21) Appl. No.: 11/556,636

(22) Filed: Nov. 3, 2006

(65) Prior Publication Data
US 2008/0109703 A1 May 8, 2008

(51) Int. Cl.
*G11C 29/768* (2006.01)
(52) U.S. Cl. .................. 714/763; 714/766; 714/768
(58) Field of Classification Search .............. 714/763, 714/766, 758, 704, 768
See application file for complete search history.

(56) References Cited

U.S. PATENT DOCUMENTS

| | | | |
|---|---|---|---|
| 5,043,940 A | 8/1991 | Harari | 365/185.03 |
| 5,070,032 A | 12/1991 | Yuan et al. | 438/267 |
| 5,095,344 A | 3/1992 | Harari | 257/328 |
| 5,172,338 A | 12/1992 | Mehrotra et al. | 365/185.03 |
| 5,233,610 A * | 8/1993 | Nakayama et al. | 714/704 |
| 5,313,421 A | 5/1994 | Guterman et al. | 365/185.15 |
| 5,315,541 A | 5/1994 | Harari et al. | 365/185.13 |
| 5,343,063 A | 8/1994 | Yuan et al. | 257/317 |
| 5,532,962 A | 7/1996 | Auclair et al. | 365/201 |
| 5,570,315 A | 10/1996 | Tanaka et al. | 365/185.22 |
| 5,657,332 A | 8/1997 | Auclair et al. | 714/763 |
| 5,661,053 A | 8/1997 | Yuan | 438/257 |
| 5,774,397 A | 6/1998 | Endoh et al. | 365/185.19 |
| 5,909,449 A | 6/1999 | So et al. | 714/721 |
| 5,930,167 A | 7/1999 | Lee et al. | 365/185.03 |
| 5,987,573 A * | 11/1999 | Hiraka | 711/156 |
| 6,046,935 A | 4/2000 | Takeuchi et al. | 365/185.03 |
| 6,222,762 B1 | 4/2001 | Guterman et al. | 365/185.03 |
| 6,279,133 B1 | 8/2001 | Vafai et al. | |
| 6,397,364 B1 | 5/2002 | Barkan | 714/746 |
| 6,456,528 B1 | 9/2002 | Chen | 365/185.03 |
| 6,467,062 B1 | 10/2002 | Barkan | 714/764 |
| 6,469,931 B1 | 10/2002 | Ban et al. | 365/185.08 |
| 6,522,580 B2 * | 2/2003 | Chen et al. | 365/185.02 |
| 6,643,188 B2 * | 11/2003 | Tanaka et al. | 365/189.16 |
| 6,674,385 B2 | 1/2004 | Micheloni et al. | 341/155 |
| 6,751,766 B2 | 6/2004 | Guterman et al. | 714/736 |
| 6,785,164 B2 | 8/2004 | Gonzalez et al. | 365/185.21 |
| 6,807,610 B2 * | 10/2004 | Frayer | 711/156 |

(Continued)

FOREIGN PATENT DOCUMENTS

EP 1137001 9/2001

(Continued)

OTHER PUBLICATIONS

International Search Report mailed Apr. 25, 2008 in International Application No. PCT/US2007/082823.

(Continued)

*Primary Examiner* — Fritz Alphonse
(74) *Attorney, Agent, or Firm* — Weaver Austin Villeneuve & Sampson LLP (57) ABSTRACT

Data is stored in a nonvolatile memory so that different pages of data stored in the same memory cells are encoded according to different encoding schemes. A first page is decoded according to its encoding scheme and an output is provided based on the decoding of the first page that is subsequently used in decoding a second page.

20 Claims, 9 Drawing Sheets

U.S. PATENT DOCUMENTS

| | | | |
|---|---|---|---|
| 6,873,549 B2 | 3/2005 | Khalid et al. | 365/185.03 |
| 6,894,926 B2 | 5/2005 | Guterman et al. | 365/185.03 |
| 6,925,007 B2 | 8/2005 | Harari et al. | 365/185.15 |
| 6,941,412 B2 | 9/2005 | Gongwer et al. | 711/103 |
| 6,952,365 B2 | 10/2005 | Gonzalez et al. | 365/185.03 |
| 6,977,844 B2 | 12/2005 | Guterman et al. | 365/185.18 |
| 6,983,428 B2 | 1/2006 | Cernea | 716/1 |
| 7,012,835 B2 | 3/2006 | Gonzalez et al. | 365/185.11 |
| 7,035,146 B2 | 4/2006 | Hemink et al. | 365/185.22 |
| 7,088,621 B2 | 8/2006 | Guterman et al. | 365/185.18 |
| 7,092,290 B2 | 8/2006 | Hemink | 365/185.18 |
| 7,203,886 B2 * | 4/2007 | Brown et al. | 714/758 |
| 7,388,781 B2 | 6/2008 | Litsyn et al. | |
| 7,588,778 B2 * | 9/2009 | Kan et al. | 424/450 |
| 7,719,892 B2 * | 5/2010 | Kim et al. | 365/185.11 |
| 7,725,628 B1 * | 5/2010 | Phan et al. | 710/72 |
| 2004/0153902 A1 * | 8/2004 | Machado et al. | 714/710 |
| 2005/0013171 A1 | 1/2005 | Ban et al. | |
| 2005/0204212 A1 | 9/2005 | Noguchi et al. | 714/710 |
| 2005/0213393 A1 | 9/2005 | Lasser | 365/185.33 |
| 2006/0101193 A1 | 5/2006 | Murin | 711/103 |
| 2007/0086239 A1 | 4/2007 | Litsyn et al. | |
| 2007/0089034 A1 | 4/2007 | Litsyn et al. | |
| 2007/0124652 A1 | 5/2007 | Litsyn et al. | |
| 2007/0150790 A1 | 6/2007 | Gross et al. | 714/763 |
| 2007/0150791 A1 | 6/2007 | Gross et al. | 714/763 |
| 2007/0171730 A1 | 7/2007 | Ramamoorthy et al. | |
| 2007/0226592 A1 * | 9/2007 | Radke | 714/766 |
| 2007/0266295 A1 | 11/2007 | Conley | |
| 2007/0266296 A1 | 11/2007 | Conley | |
| 2007/0283227 A1 | 12/2007 | Sharon et al. | |
| 2008/0010581 A1 | 1/2008 | Alrod et al. | |
| 2008/0072120 A1 * | 3/2008 | Radke | 714/768 |
| 2008/0082897 A1 | 4/2008 | Brandman et al. | |
| 2008/0092014 A1 | 4/2008 | Brandman et al. | |
| 2008/0092015 A1 | 4/2008 | Brandman et al. | |
| 2008/0092026 A1 | 4/2008 | Brandman et al. | |
| 2008/0109703 A1 | 5/2008 | Brandman | |
| 2008/0123419 A1 | 5/2008 | Brandman et al. | |
| 2008/0123420 A1 | 5/2008 | Brandman et al. | |

FOREIGN PATENT DOCUMENTS

| | | |
|---|---|---|
| WO | WO 2008/057820 | 5/2008 |

OTHER PUBLICATIONS

Written Opinion of the International Searching Authority mailed Apr. 25, 2008 in International Application No. PCT/US2007/082823.

U.S. Appl. No. 11/383,401, filed May 15, 2006, Conley.

U.S. Appl. No. 11/383,405, filed May 15, 2006, Conley.

U.S. Appl. No. 11/536,286, filed Sep. 28, 2006, Brandman et al.

U.S. Appl. No. 11/536,327, filed Sep. 28, 2006, Brandman et al.

U.S. Appl. No. 11/536,347, filed Sep. 28, 2006, Brandman et al.

U.S. Appl. No. 11/536,372, filed Sep. 28, 2006, Brandman et al.

U.S. Appl. No. 11/556,615, filed Nov. 3, 2006, Brandman et al.

U.S. Appl. No. 11/556,626, filed Nov. 3, 2006, Brandman et al.

U.S. Appl. No. 11/556,632, filed Nov. 3, 2006, Brandman.

"Noisy Channel Coding Theorem", Wikipedia, http://en.wikipedia.org/wiki/Shannon%27s_theorem, downloaded Mar. 23, 2006, 3 pages.

"Convolutional Code", Wikipedia, http://en.wikipedia.org/wiki/Convolutional_code, downloaded Mar. 23, 2006, 2 pages.

"Turbo Code", Wikipedia, http://en.wikipedia.org/wiki/Turbo_code, downloaded Mar. 23, 2006, 4 pages.

Chip Fleming, "A Tutorial on Convolutional Coding with Viterbi Decoding," http://home.netcom.com/~chip.f/viterb/tutorial.html, dated Jan. 31, 2003, downloaded Mar. 23, 2006, 5 pages.

"Error Correcting Codes", http://www.dcs.ed.ac.uk/home/stg/pub/E/ecc.html, downloaded Mar. 18, 2005, 2 pages.

Bernard Sklar, "Fundamentals of Turbo Codes," Prentice Hall, Mar. 15, 2002, 30 pages.

R.Y.S. Tee et al., "Generalized Low-Density Parity-Check Coding Aided Multilevel Codes," IEEE, 2006, 5 pages.

U.S. Office Action mailed Dec. 29, 2009 in U.S. Appl. No. 11/556,632.

* cited by examiner

| Page | | S0 | S1 | S2 | S3 | S4 | S5 | S6 | S7 | S8 | S9 | S10 | S11 | S12 | S13 | S14 | S15 | |
|---|---|---|---|---|---|---|---|---|---|---|---|---|---|---|---|---|---|---|
| 3 | MSB | 1 | 1 | 1 | 1 | 1 | 1 | 1 | 1 | 0 | 0 | 0 | 0 | 0 | 0 | 0 | 0 | ← 848 |
| 2 | | 1 | 1 | 1 | 1 | 0 | 0 | 0 | 0 | 1 | 1 | 1 | 1 | 0 | 0 | 0 | 0 | ← 846 |
| 1 | | 1 | 1 | 0 | 0 | 1 | 1 | 0 | 0 | 1 | 1 | 0 | 0 | 1 | 1 | 0 | 0 | ← 844 |
| 0 | LSB | 1 | 0 | 1 | 0 | 1 | 0 | 1 | 0 | 1 | 0 | 1 | 0 | 1 | 0 | 1 | 0 | ← 842 |

*FIG. 8A*

| Page | | S0 | S2 | S4 | S6 | S8 | S10 | S12 | S14 | |
|---|---|---|---|---|---|---|---|---|---|---|
| 3 | MSB | 1 | 1 | 1 | 1 | 0 | 0 | 0 | 0 | ← 848 |
| 2 | | 1 | 1 | 0 | 0 | 1 | 1 | 0 | 0 | ← 846 |
| 1 | | 1 | 0 | 1 | 0 | 1 | 0 | 1 | 0 | ← 844 |
| 0 | LSB | 1 | 1 | 1 | 1 | 1 | 1 | 1 | 1 | ← 842 |

*FIG. 8B*

| Page | | S0 | S4 | S8 | S12 | |
|---|---|---|---|---|---|---|
| 3 | MSB | 1 | 1 | 0 | 0 | ← 848 |
| 2 | | 1 | 0 | 1 | 0 | ← 846 |
| 1 | | 1 | 1 | 1 | 1 | ← 844 |
| 0 | LSB | 1 | 1 | 1 | 1 | ← 842 |

*FIG. 8C*

| Page | | S0 | S8 | |
|---|---|---|---|---|
| 3 | MSB | 1 | 0 | ← 848 |
| 2 | | 1 | 1 | ← 846 |
| 1 | | 1 | 1 | ← 844 |
| 0 | LSB | 1 | 1 | ← 842 |

NONVOLATILE MEMORY WITH MODULATED ERROR CORRECTION CODING

CROSS-REFERENCE TO RELATED APPLICATIONS

This application is related to U.S. patent application Ser. No. 11/556,632, filed Nov. 3, 2006, entitled "Methods of Modulating Error Correction Coding", U.S. patent application Ser. No. 11/566,615, filed Nov. 3, 2006, entitled "Methods of Varying Read Threshold Voltage in Nonvolatile Memory", and U.S. patent application Ser. No. 11/556,626, filed Nov. 3, 2006, now issued as U.S. Pat. No. 7,558,109, issued Jul. 7, 2009, entitled "Nonvolatile Memory With Variable Read Threshold". These applications are incorporated in their entirety by reference as if fully set forth herein.

This application is also related to U.S. patent application Ser. No. 11/536,286, filed Sep. 28, 2006, now issued as U.S. Pat. No. 7,818,653, issued Oct. 19, 2010, entitled "Methods of Soft-Input Soft-Output Decoding for Nonvolatile Memory," U.S. patent application Ser. No. 11/536,327, filed Sep. 28, 2006, entitled "Soft-Input Soft-Output Decoder for Nonvolatile Memory, " U.S. patent application Ser. No. 11/536,347, filed Sep. 28, 2006, now issued as U.S. Pat. No. 7,805,663, issued Sep. 28, 2010, entitled "Methods of Adapting Operation of Nonvolatile Memory," and U.S. patent application Ser. No. 11/536,372 filed Sep. 28, 2006, entitled "Nonvolatile Memory with Adaptive Operation." These applications are incorporated in their entirety by reference as if fully set forth herein.

BACKGROUND OF THE INVENTION

This invention relates to nonvolatile memory systems and to methods of operating nonvolatile memory systems.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Data stored in a nonvolatile memory system may contain erroneous bits when data is read. Traditional ways to reconstruct corrupted data include the application of Error Correction Codes (ECCs). Simple Error Correction Codes encode data by storing additional parity bits, which set the parity of groups of bits to a required logical value, when the data is written into the memory system. If during storage the data is erroneous, the parity of groups of bits may change. Upon reading the data from the memory system, the parity of the group of the bits is computed once again by the ECC. Because of the data corruption the computed parity may not match the required parity condition, and the ECC may detect the corruption.

ECCs can have at least two functions: error detection and error correction. Capability for each of these functions is typically measured in the number of bits that can be detected as erroneous and subsequently corrected. Detection capability can be the same or greater than the correction capability. A typical ECC can detect a higher number of error bits than it can correct. A collection of data bits and parity bits is sometimes called a word. An early example is the (7,4) Hamming code, which has the capability of detecting up to two errors per word (seven bits in this example) and has the capability of correcting one error in the seven-bit word.

More sophisticated ECCs can correct more than a single error per word, but it becomes computationally increasingly complex to reconstruct the data. Common practice is to recover the data with some acceptably small likelihood of incorrect recovery. However with increasing number of errors the probability of reliable data recovery also decreases rapidly or the associated costs in additional hardware and/or performance become prohibitively high.

In semiconductor memory devices, including EEPROM systems, data can be represented by the threshold voltages of transistors. Typically, different digital data storage values correspond to different voltage ranges. If, for some reason, during the read operation the voltage levels shift from their preferred ranges, an error occurs. The error may be detected by the ECC and in some cases these errors may be corrected.

SUMMARY OF INVENTION

An exemplary method of storing data in a nonvolatile semiconductor memory array comprises: encoding a first portion of data according to a first encoding scheme to obtain a first plurality of encoded data bits; storing the first plurality of encoded data bits in a plurality of cells of the memory array, each of the plurality of cells containing at least one of the first plurality of encoded data bits; and storing a second plurality of data bits in the plurality of cells with the first plurality of encoded data bits, each of the plurality of cells containing at least one of the second plurality of data bits, the second plurality of data bits not being encoded according to the first encoding scheme.

Another exemplary method of decoding data stored in a nonvolatile semiconductor memory array comprises: reading data stored in a plurality of cells, each of the plurality of cells containing at least a first data bit and a second data bit; using results of the reading to generate a plurality of first corrected data values corresponding to the plurality of first data bits, the plurality of first corrected data values generated by ECC correction of the plurality of first data bits; and subsequently using results of the reading and also using the plurality of first corrected data values to generate a plurality of second corrected data values corresponding to the plurality of second data bits.

An exemplary nonvolatile semiconductor memory system comprises: a memory array that includes a plurality of memory cells that individually hold a first bit of data of a first page and a second bit of data of a second page; and an ECC encoder that encodes data of the first page according to a first encoding scheme prior to storage in the plurality of cells and does not encode data of the second page according to the first encoding scheme prior to storage in the plurality of cells.

Another exemplary nonvolatile semiconductor memory system comprises: a flash memory array that stores data in a plurality of cells, an individual cell storing at least a first data bit of a first page of data and a second data bit of a second page of data; and an ECC decoding system that first decodes the first page of data and subsequently uses results of the decoding of the first page of data to decode the second page of data.

DETAILED DESCRIPTION OF ILLUSTRATED EMBODIMENTS

Figure 1:
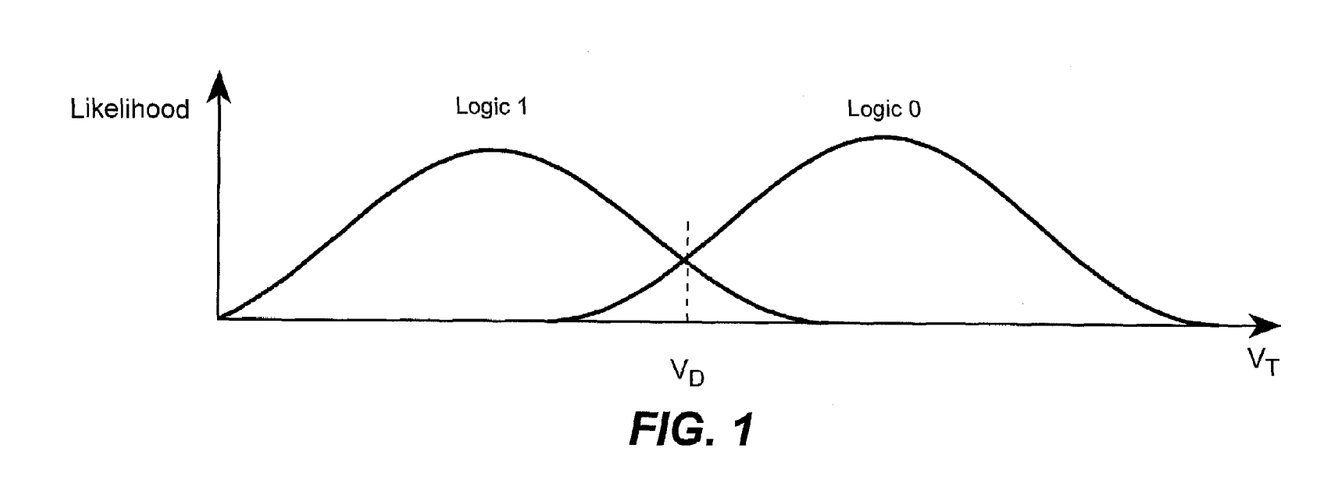
FIG. 1 shows likelihood functions of threshold voltages of cells programmed to a logic 1 state and a logic 0 state in a nonvolatile memory, including a voltage $V_D$ used to discriminate logic 1 and logic 0 states.

In many nonvolatile memories, data read from a memory array may have errors. That is, individual bits of input data that are programmed to a memory array may later be read as being in a different logical value. FIG. 1 shows the relationship between a physical parameter indicating a memory cell state (threshold voltage, $V_T$) and the logical values to which the memory cell may be programmed. In this example, only two states are stored in the cell. Thus, the cell stores one bit of data. Cells programmed to the logic 0 state generally have a higher threshold voltage than cells in the logic 1 (unprogrammed) state. In an alternative scheme, the logic 1 state is the unprogrammed state of the memory cell. The vertical axis of FIG. 1 indicates the likelihood of reading a cell at any particular threshold voltage based upon expected threshold voltage distribution. A first likelihood function is shown for cells programmed to logic 1 and a second for cells programmed to logic 0. However, these functions have some degree of overlap between them. A discrimination voltage $V_D$ is used in reading such cells. Cells having a threshold voltage below $V_D$ are considered to be in state 1, while those having a threshold voltage above $V_D$ are considered to be in state 0. As FIG. 1 shows, this may not always be correct. Because of the overlap between functions, there is a non-zero likelihood that a memory cell programmed to a logic 1 state will be read as having a threshold voltage greater than $V_D$ and so will be read as being in a logic 0 state. Similarly, there is a non-zero likelihood that a memory cell programmed to a logic 0 state will be read as having a logic 1 state.

Overlap between functions occurs for a number of reasons including physical defects in the memory array and disturbance caused to programmed cells by later programming or reading operations in the memory array. Overlap may also occur due to a general lack of ability to keep a large number of cells within a very tight threshold voltage range. Certain programming techniques may allow functions of threshold voltages to be narrowed (have smaller standard deviations). However, such programming may take more time. In some memory systems, more than one bit is stored in a memory cell. In general, it is desirable to store as many bits as possible in a memory cell. In order to efficiently use the available threshold voltage range, functions for adjacent states may be such that they significantly overlap.

Nonvolatile memory systems commonly employ ECC methods to overcome errors that occur in data that is read from a memory array. Such methods generally calculate some additional ECC bits from input data to be stored in a memory array according to an encoding system. Other ECC schemes may map input data to output data in a more complex way. The ECC bits are generally stored along with the input data but may be stored separately. The input data and ECC bits are later read from the nonvolatile memory array together and a decoder uses both the data and ECC bits to check if any errors are present. In some cases, such ECC bits may also be used to identify a bit that is in error. The erroneous bit is then corrected by changing its state (changed from a "0" to a "1" or from a "1" to a "0"). Appending ECC bits to data bits is not the only way to encode data before storing it in a nonvolatile memory. For example, data bits may be encoded according to a scheme that provides the following transformations: 00 to 1111, 01 to 1100, 10 to 0011 and 11 to 0000.

Figure 2:
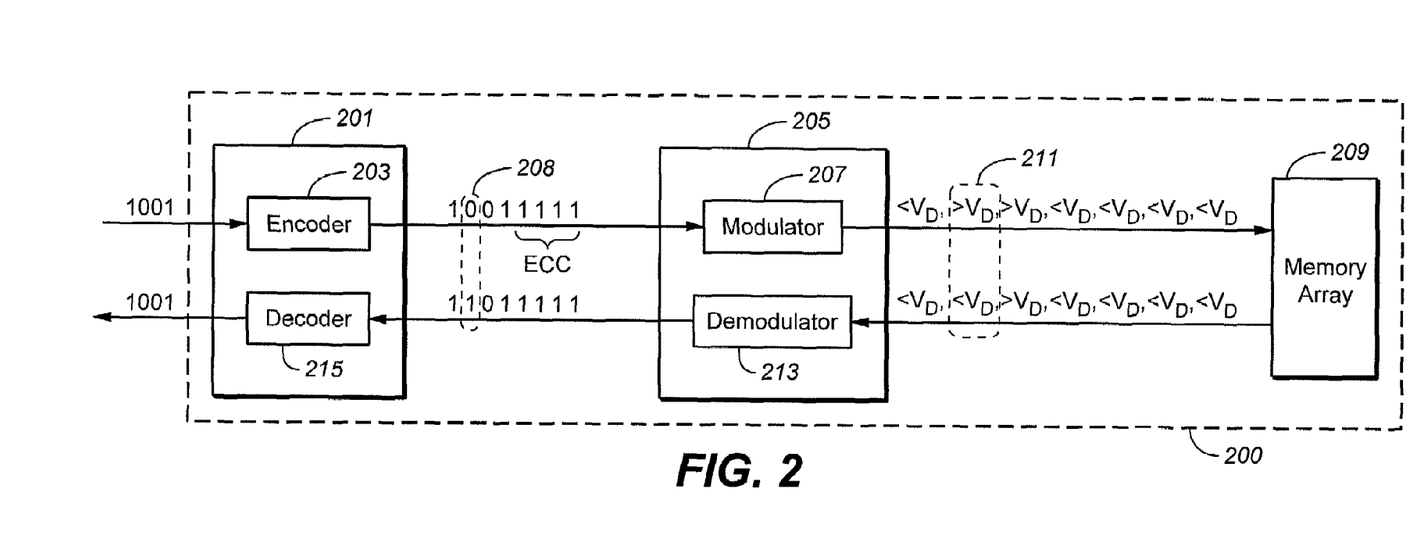
FIG. 2 shows components of a memory system including a memory array, modulator/demodulator circuits and encoder/decoder circuits.

FIG. 2 shows an example of input data being stored in a memory system 200. Input data is first received by an ECC unit 201 that includes an encoder 203. The input data may be host data to be stored in memory system 200 or may be data generated by a memory controller. The example of FIG. 2 shows four input data bits 1001. Encoder 203 then calculates ECC bits (1111) from the input data bits using an encoding scheme. One example of an encoding scheme is to generate ECC bits that are parity bits for selected groups of data bits.

Both the input data bits and the ECC bits are then sent to a modulation/demodulation unit 205 that includes a modulator 207. Modulator 207 converts the digital data sent by ECC unit 201 to a form in which it is written in a memory array 209. In one scheme, the digital data is converted to a plurality of threshold voltage values in a plurality of memory cells. Thus, various circuits used to convert digital data to a stored threshold voltage in a memory cell may be considered to form a modulator. In the example of FIG. 2, each memory cell may hold one bit of data. Thus, each memory cell may have a threshold voltage in one of two ranges, one signifying a logic "1" state and the other signifying a logic "0" state as shown in FIG. 1. The memory cells storing a logic "1" state have a threshold voltage that is less than $V_D(<V_D)$ while the memory cells storing a logic "0" state have a threshold voltage that is greater than $V_D(>V_D)$. Cells may be programmed and verified to a nominal threshold voltage higher than $V_D$ to ensure that, at least initially, there is some preferred separation between cells programmed to the two logic states.

Data may be stored in memory array 209 for some period of time. During this time, various events may occur to cause threshold voltages of memory cells to change. In particular, operations involving programming and reading may require voltages to be applied to word lines and bit lines in a manner that affects other previously programmed cells. Such disturbs are particularly common where dimensions of devices are reduced so that the interaction between adjacent cells is significant. Charge may also be lost over long periods of time. Such data retention failures can also cause data to change when read. As a result of such changes, data bits may be read out having different states than the data bits originally programmed. In the example of FIG. 2, one input data bit 211 is read as having a threshold value less than $V_D(<V_D)$ when it was originally written having a threshold value greater than $V_D(>V_D)$.

The threshold voltages of memory cells are converted to bits of data by a demodulator 213 in modulation/demodulation unit 205. This is the reverse of the process performed by the modulator. Demodulator 213 may include sense amplifiers that read a voltage or current from a memory cell in memory array 209 and derive the state of the cell from the reading. In the example of FIG. 2, a memory cell having a threshold voltage less than $V_D(<V_D)$ gives a demodulated output of "1" and a memory cell having a threshold voltage that is greater than $V_D(>V_D)$ gives a demodulated output of "0." This gives the output sequence 11011111 shown. The second bit 208 of this sequence is in error as a result of being stored in the memory array 209.

The output of demodulator 213 is sent to a decoder 215 in ECC unit 201. Decoder 215 determines from data bits and ECC bits if there are any errors. If a small number of errors is present that is within the correction capability of the code, the errors are corrected. If large numbers of errors are present, they may be identified but not corrected if they are within the detection capability of the code. If the number of errors exceeds the detection capability of the code, the errors may not be detected, or may result in an erroneous correction. In the example of FIG. 2, the error in the second bit is detected and is corrected. This provides an output (1001) from decoder 215 that is identical to the input sequence. The decoding of memory system 200 is considered to be hard-input hard-output decoding because decoder 215 receives only data bits representing input data bits and ECC bits, and decoder 215 outputs a corrected sequence of data bits corresponding to input data bits (or fails to give an output if the number of errors is too high).

Figure 3:
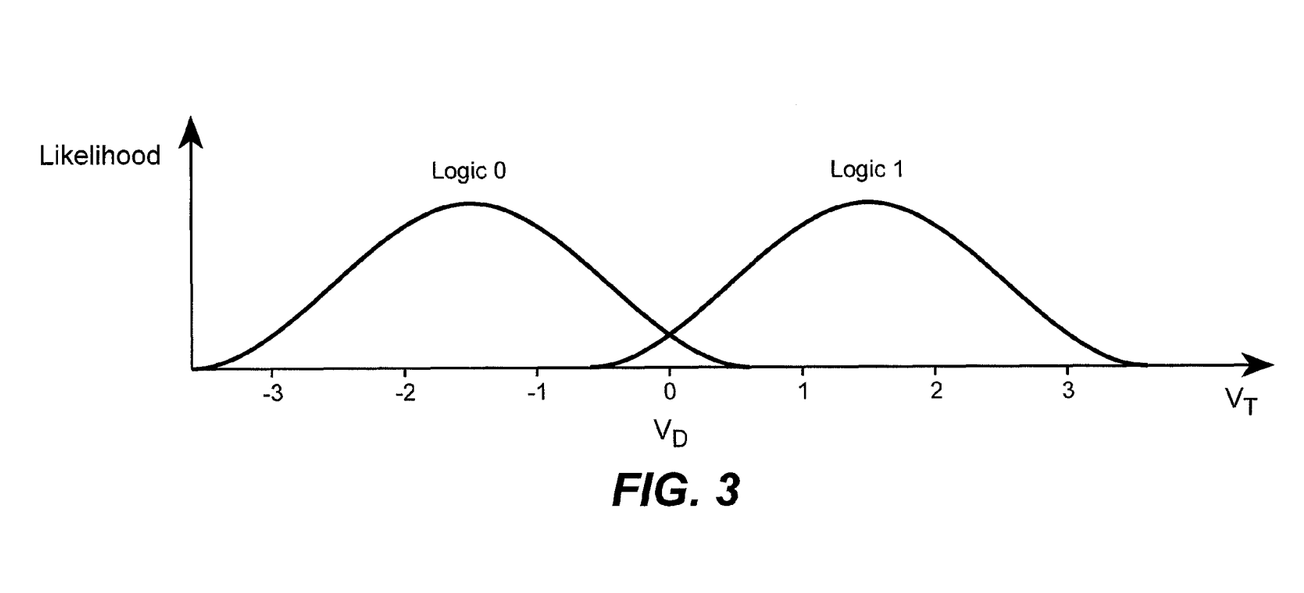
FIG. 3 shows likelihood functions of read threshold voltages of cells programmed to a logic 1 state and a logic 0 state, showing threshold voltage values.
Figure 4:
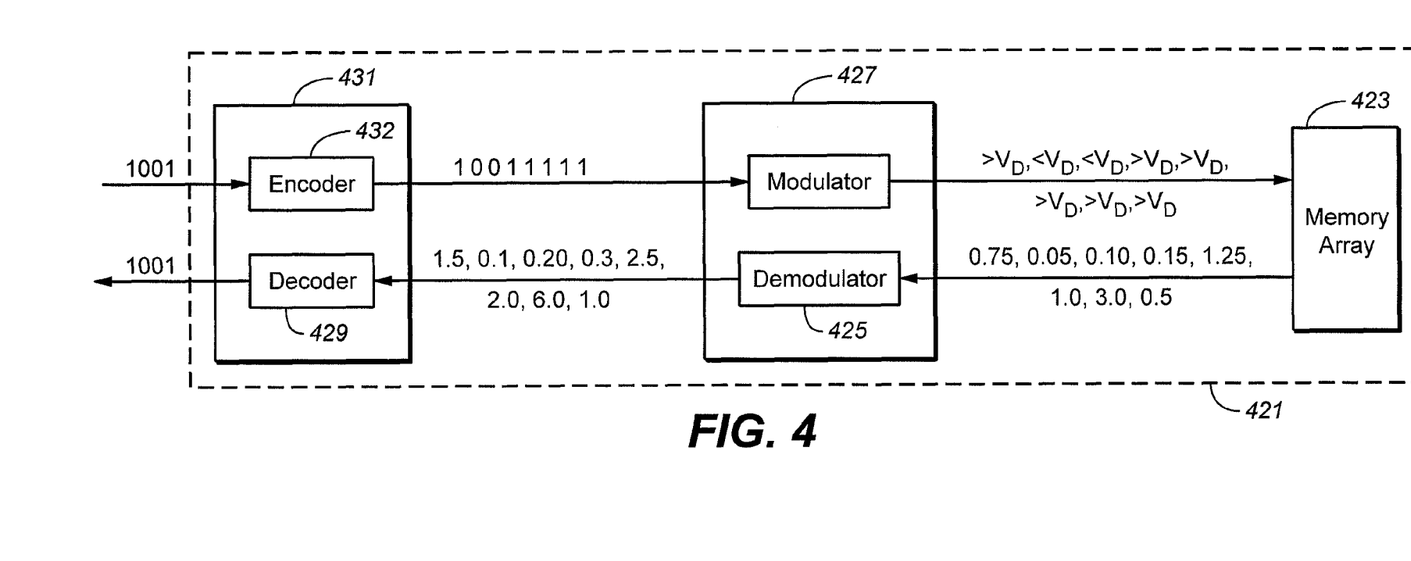
FIG. 4 shows components of a memory system including a memory array, modulator/demodulator circuits and encoder/decoder circuits, a demodulator providing likelihood values to a decoder.

An alternative memory system to memory system 200 is shown in FIGS. 3 and 4. FIG. 3 shows similar functions to those of FIG. 1 with $V_D=0$ and with threshold voltages below $V_D$ representing logic 0 and voltages above $V_D$ representing logic 1. Instead of showing a single voltage $V_D$ dividing threshold voltages into two different ranges, here the threshold voltages are indicated by actual voltage numbers. The function corresponding to logic "1" is centered above 0 volts and the function corresponding to logic "0" is centered below 0 volts.

FIG. 4 shows a memory system 421 using a data storage process that is similar to that of memory system 200 (using the same input data bits and ECC bits) with a different read process. In particular, instead of simply determining whether a threshold voltage is above or below a particular value, memory system 421 reads threshold voltages as shown in FIG. 3. It will be understood that actual threshold voltage is not necessarily read. Other means of cell operation may be used to store and retrieve data (e.g. current sensing). Voltage sensing is merely used as an example. Generally, threshold voltage refers to a gate voltage at which a transistor turns on. FIG. 4 shows a read occurring that provides more detailed information than the previous example. This may be considered a read with a higher resolution than that of FIG. 2 (and a resolution that resolves more states than are used for programming). As in the previous example, errors occur in the read data. Here, the readings corresponding to the second and third bits are in error. The second and third bits were logic "0" and were stored by programming a cell to have a threshold voltage less than $V_D$ but the cells are read as having threshold voltages of 0.05 volts and 0.10 volts which is higher than $V_D$ ($V_D=0$ volts).

The raw voltages read from memory array 423 of FIG. 4 by a series of read operations are sent to a demodulator 425 in a modulation/demodulation unit 427. The raw voltages have a finite resolution dictated by the resolution of the Analog-to-Digital conversion. Here, raw data is converted into likelihood data. In particular, each cell reading is converted into a likelihood that the corresponding bit is a one or a zero. The series of readings from the memory array (0.75, 0.05, 0.10, 0.15, 1.25, 1.0, 3.0, and 0.5 volts) can indicate not only the state of the cell, but can also be used to provide a degree of certainty as to that state. This may be expressed as a likelihood that a memory cell was programmed with a particular bit. Thus, readings that are close to 0 volts may give low likelihood values, while readings that are farther from 0 volts give higher likelihood values. The likelihood values shown are log likelihood ratios (explained in detail below). This provides negative numbers for cells in a logic 0 state and positive numbers for cells in a logic 1 state, with the magnitude of the number indicating the likelihood that the state is correctly identified. The second and third likelihood values (0.1, 0.2) indicate logic "1". The second and third values indicate likelihoods that are quite low.

Likelihood values are sent to a decoder 429 in an ECC unit 431 (in some cases, obtaining likelihood values from raw values may be considered as being performed in the decoder). ECC unit 431 also includes encoder 432. The decoder 429 performs decoding operations on likelihood values. Such a decoder may be considered a soft-input decoder. In general, soft-input refers to an input that includes some quality information related to data that are to be decoded. The additional information provided as a soft-input generally allows a decoder to obtain better results. A decoder may perform decoding calculations using a soft-input to provide calculated likelihood values as an output. This is considered a soft-output and such a decoder is considered a Soft-Input Soft-Output (SISO) decoder. This output can then be used again as input to the SISO decoder to iterate the decoding and improve results. A SISO decoder may form part of a larger decoder that provides a hard output to another unit. SISO decoders generally provide good performance and in some cases may provide better performance than is possible with hard-input hard-output decoding. In particular, for the same amount of overhead (number of ECC bits) a SISO decoder may provide greater error correction capability. In order to efficiently use a SISO decoder, a suitable encoding/decoding scheme may be implemented and demodulation is adapted to efficiently obtain a soft-input without excessive complexity and without requiring excessive time for reading data from the memory array.

In one embodiment, a soft-input for a SISO decoder is provided by reading data in a nonvolatile memory array with a resolution that resolves a larger number of states than were used in programming the memory. Thus, data may be written by programming a memory cell to one of two threshold voltage ranges and subsequently read by resolving three or more threshold voltage ranges. Typically, the number of threshold voltage ranges used in reading will be some multiple of the number of threshold voltage ranges used in programming (for example, twice as many). However, this is not always the case.

An ECC unit may be formed as a dedicated circuit or this function may be performed by firmware in a controller. Typically, a controller is an Application Specific Integrated Circuit (ASIC) that has circuits designed for specific functions such as ECC and also has firmware to manage controller operations. Thus, an encoder/decoder may be formed by a combination of hardware and firmware in the memory controller. An encoder/decoder (ECC unit) may alternatively be located on the memory chip. The modulation/demodulation unit may be on a memory chip, on a controller chip, on a separate chip or some combination. Generally, a modulation/demodulation unit will include at least some components on the memory chip (such as peripheral circuits connected to a memory array). While FIG. 4 indicates threshold voltages being read to a high resolution (an analog read), the degree of resolution chosen may depend on a number of factors including the type of nonvolatile memory used.

Figure 5:
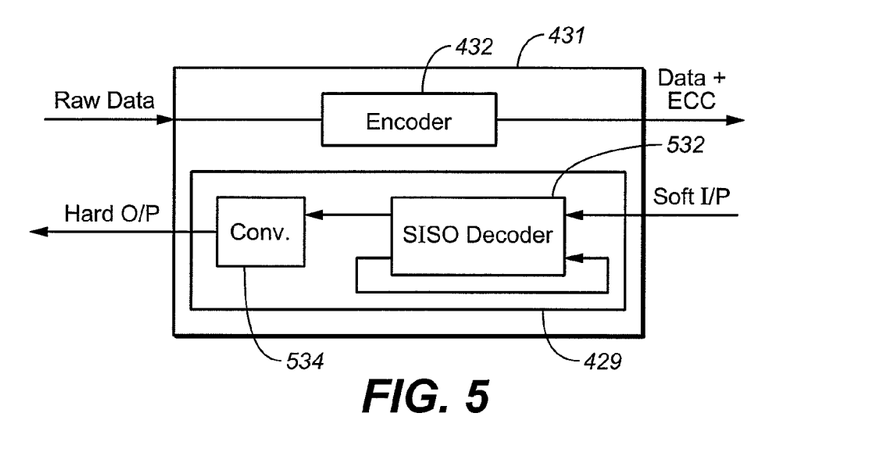
FIG. 5 shows an ECC unit having a Soft-Input Soft-Output (SISO) decoder.

FIG. 5 shows a more detailed view of ECC unit 431, particularly decoder 429. Decoder 429 includes a SISO decoder 532 and a soft-hard converter 534. SISO decoders generally accept raw likelihood data and perform ECC calculations on the raw likelihood data to provide calculated likelihood data. The calculated likelihood data may be considered a soft-output. In many cases, such a soft-output is then provided as an input to the SISO decoder so that a second decoding iteration is performed. A SISO decoder may perform successive iterations until at least one predetermined condition is achieved. For example, a predetermined condition may be that all bits have a likelihood that is greater than a certain minimum value. A predetermined condition could also be an aggregate of likelihood values such as a mean likelihood value. A predetermined condition may be convergence of results from one iteration to the next (i.e. keep iterating until there is little improvement from additional iterations). A predetermined condition may be that a predetermined number of iterations are completed. Combinations of these conditions may also be used. Decoding is performed using an encoded pattern in the data that is the result of encoding performed by encoder 432 on the data before it was stored. Encoder 432 and decoder 429 are both considered parts of ECC unit 431.

Efficient decoding depends on having a suitable encoding/decoding scheme. Various schemes are known for encoding data in a manner that is suitable for subsequent decoding in a SISO decoder such as SISO decoder 532. Encoding/decoding schemes include, but are not limited to, turbo codes, product codes, BCH codes, Reed-Solomon codes, convolutional codes (see U.S. patent application Ser. Nos. 11/383,401 and 11/383,405), Hamming codes, and Low Density Parity Check (LDPC) codes. A detailed description of LDPC codes and turbo codes and how they may be used with SISO decoding is provided in U.S. patent application Ser. Nos. 11/536,286 and 11/536,327, entitled "Soft-input soft-output decoder for nonvolatile memory" and "Methods of soft-input soft-output decoding for nonvolatile memory" respectively, filed on Sep. 28, 2006.

In some cases statistics may be collected regarding correction carried out by an ECC decoder. Such statistics may be used to make adjustments in operating parameters of a memory array. U.S. patent applications Ser. Nos. 11/536,347 and 11/536,372 filed on Sep. 28, 2006 describe nonvolatile memory systems with operating parameters that are adjusted and methods for adjusting such parameters.

Figure 6:
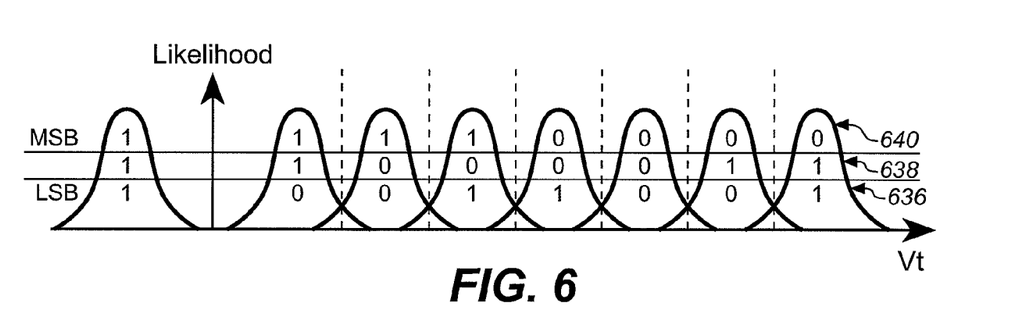
FIG. 6 shows the threshold voltage range of a memory cell that stores three bits of data and shows how the three bits are mapped to eight memory states.

In some memory arrays, individual memory cells hold more than one bit of data. Such multi-level cell (MLC) memories map bits of data to memory states. For example, in a flash memory, more than two bits of data may be mapped to memory states, with each state having an assigned threshold voltage range. FIG. 6 shows an example where three bits of data are stored in a memory cell. The three bits of data require eight ($2^3$) different memory states. Typically, data is programmed to an MLC memory in units of a page, where each bit in a cell is from a different page. Thus, in FIG. 6, the lowest bit 636 (Least Significant Bit, or LSB) is in one page, the middle bit 638 is in another page and the highest bit 640 (Most Significant Bit, or MSB) is in yet another page. Mapping of bits to memory states may be according to any convenient scheme.

Figures 7A, 7B:
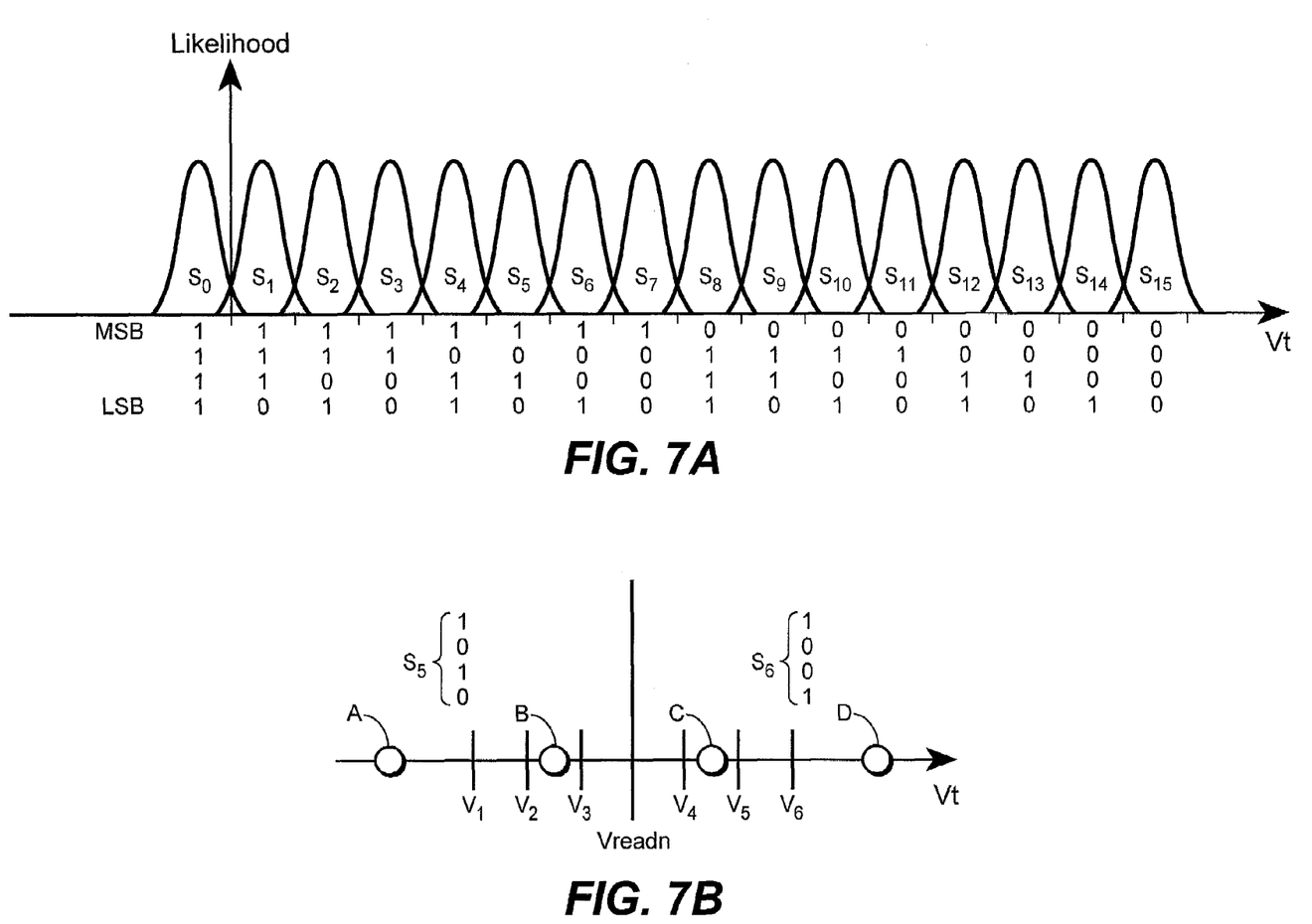
FIG. 7A shows the threshold voltage range of a memory cell that stores four bits of data and shows how the three bits are mapped to sixteen memory states so that the least significant bit of adjacent states is different.
FIG. 7B shows an example of voltages used to read the memory cell of FIG. 7A to provide a soft-input for ECC decoding.

FIG. 7A shows an example where the threshold voltage of a memory cell is mapped to sixteen different memory states S0-S15, to store four bits of data. Unlike the example of FIG.

6, here bits are mapped to memory states so that the LSB is different for adjacent states. Other bits also differ between adjacent states. In one example, the LSB is decoded first and is used to decode higher bits. Because the LSB of a particular memory state is different from its neighbors, determining the LSB helps to resolve between adjacent states.

FIG. 7B shows a discrimination voltage Vreadn between adjacent memory states S5 (1010) and S6 (1001). Additional read voltages V1-V6 are used to provide additional resolution within memory states S5 and S6. FIG. 7B shows four different threshold voltage readings A-D corresponding to four readings of cell threshold voltages. Such readings may be used to provide a soft-input for soft-input decoding. Adjacent states S5 and S6 differ in both of the two least significant bits. Where a cell is read as having a particular threshold voltage, this indicates four bits. However, if there is an error in the read voltage so that the read voltage corresponds to another state, more than one bit (as many as four in this example) may be erroneous and may require correction. In some cases, each page is separately subject to ECC correction, with each erroneous bit requiring separate correction so that a single misread state may require four errors to be separately corrected.

In an alternative method of correcting stored data, correction of one bit may provide information that is then used in correction of other bits stored in the same cell. For example, a cell may be read as having a threshold voltage reading B that indicates memory state S5 (1010), so that the LSB (first bit) would be 0 and the next bit would be a 1. When ECC correction is performed on the LSB (e.g. correction performed on page containing LSB), the ECC correction may indicate that the LSB is 1. Given that B is close to Vreadn and the LSB is a 1, it is likely that the programmed state was S6 (1001). This indicates that the second bit is probably a 0, not a 1. Thus, the result of ECC correction performed on the LSB indicates a probable value for the second bit. Based only on the cell's threshold voltage, the second bit would be erroneously determined to be a 1. However, the ECC corrected LSB indicates that the second bit is likely to be 0. This additional information regarding the second bit may be provided to an ECC decoder that determines the second bit. The additional information may allow decoding of data that contains a higher number of errors, or may allow decoding with a smaller number of redundant bits. Results of decoding the second bit may be similarly used in decoding a third bit and so on for higher bits.

In one example, where a cell contains more than one bit of data, a first bit (along with other encoded bits in other cells) is decoded first and the results of this decoding are used to provide an indication for at least one subsequent bit. In one scheme, a first bit is corrected with a high degree of certainty and the result of this correction is used in determining additional bits in the cell. Data in different pages may be encoded with different levels of redundancy so that at least one page can be corrected even where it contains a large number of errors. Once a first page is corrected, the results may be used in correcting additional pages stored in the same cells. The additional pages do not necessarily need the same level of redundancy because the correction of the first page of data provides additional information regarding the bits of the additional pages. The scheme of FIGS. 7A and 7B show a suitable mapping of bits to memory states so that decoding the LSB provides information for decoding higher bits.

Figure 8A:
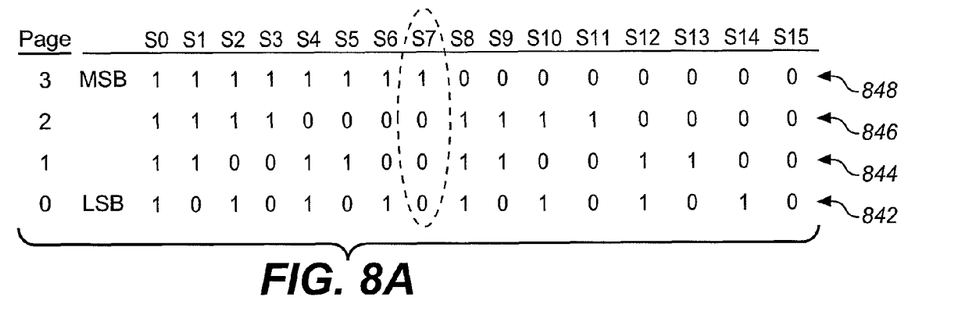
FIG. 8A shows sixteen memory states of a memory cell that are considered in determining a first bit (LSB).

FIG. 8A shows sixteen memory states S0-S15 of FIG. 7A mapped to four bits 842, 844, 846, 848 of a memory cell. The four bits are 842, 844, 846, 848 from four different pages, pages 0-3 respectively. The memory cell may be read by determining its threshold voltage with a certain resolution. For example, the threshold voltage may lie in a threshold voltage range that indicates that the memory state is S7. In some cases some probability information is also obtained during reading as previously described. The information that is read from this cell and other cells of page 0 is sent to an ECC decoder (e.g. a SISO decoder) where a first ECC operation generates corrected data bits corresponding to the LSBs of the cells. For example, it may be determined that the LSB 842 is a 1, so state S7 is not correct. This information may be used in decoding higher bits 844, 846, 848.

Figure 8B:
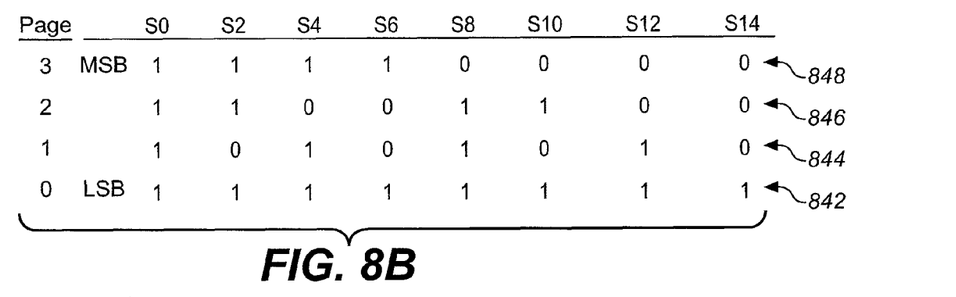
FIG. 8B shows eight remaining memory states of the memory cell that are considered in determining a second bit, the other eight states eliminated as a result of ECC decoding of the first bit.

Because the LSB is a 1, all memory states having a 0 as LSB 842 may be eliminated from consideration in determining the second bit as shown in FIG. 8B. This means that the remaining eight states (S0, S2, S4, S6, S8, S10, S12, S14) can be considered to have larger margins than the original sixteen states S0-S15 (the threshold voltage ranges mapped to remaining states may be expanded to occupy the ranges of eliminated states). The threshold voltage of the cell may be compared with the expanded threshold voltage ranges of the remaining states. This provides a higher probability of obtaining a correct result because of the increased margin. Thus, the threshold voltage reading that previously indicated state S7, may now indicate state S8 because S7 is eliminated. A second ECC operation generates corrected data bits for bits of page 1. The second ECC operation has the benefit of the result of the first ECC operation on bits of page 0 so that it may not need as high a level of redundancy. In the example of FIG. 8B it is determined through ECC decoding that bit 844 of page 1 stored in the cell is a 1. This is then used in determining the next bit 846.

Figure 8C:
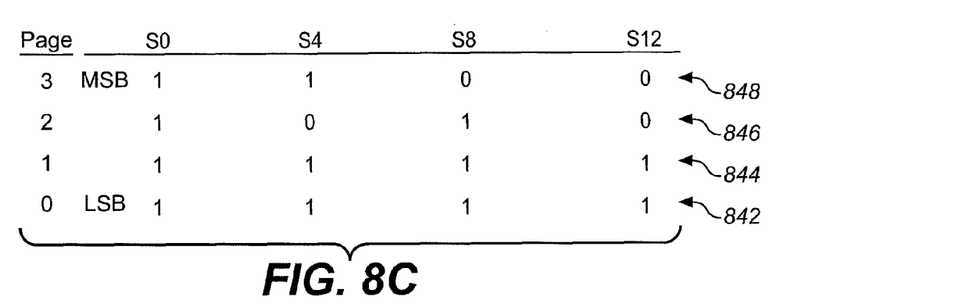
FIG. 8C shows four remaining memory states of the memory cell that are considered in determining a third bit, an additional four states being eliminated as a result of ECC decoding of the second bit.

FIG. 8C shows the remaining states (S0, S4, S8, S12) when it is determined that the two least significant bits 842, 844 are 1s. Because certain states are eliminated, the margin is increased for remaining states. For example, a threshold voltage reading corresponding to S7 would indicate S8 given that S5-S7 are eliminated at this point. Thus, the results of decoding the two least significant bits 842, 844 provide information that helps in obtaining the next bit 846. Decoding is performed based on the increased margins and a 1 is obtained for bit 846 of page 2.

Figure 8D:
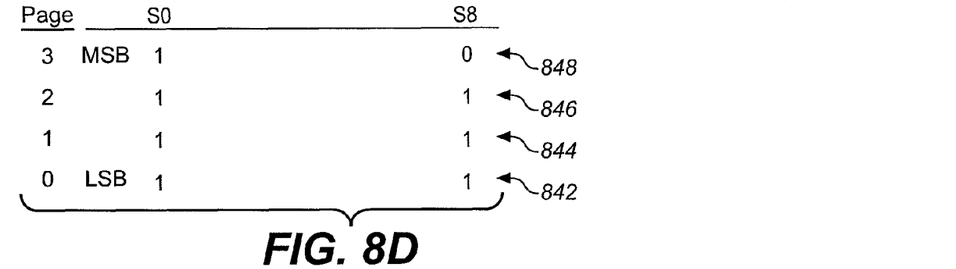
FIG. 8D shows two remaining memory states of the memory cell that are considered in determining a fourth bit, an additional two states being eliminated as a result of ECC decoding of the third bit.

FIG. 8D shows the remaining states (S0, S8) when it is determined that bit 846 of page 2 is a 1. It can be seen that the remaining states (S0-S8) have wide margins that allow the MSB 848 to be determined with a high probability. The result of such a determination is then decoded to obtain a corrected value for MSB 848. For example, where the threshold voltage indicates state S7, given the remaining states, S8 is the most likely state and MSB 848 is most likely a 0.

The above example may be carried out using either soft-input or hard-input for the first ECC decoding operation. Subsequent ECC operations receive soft-input because both data received from reading the memory cell and data from the earlier ECC decoding is considered in the ECC decoding. In one example, a memory cell is read with a resolution that resolves programmed memory states and also resolves within the programmed memory states to provide probability values with respect to bits stored in the memory cell. In such an example, probability values corresponding to higher bits may be adjusted according to the results of decoding lower bits. This provides another way of using the results of a first ECC decoding operation in a second ECC decoding operation. Adjusting margins for remaining states or adjusting probabilities for remaining bits are simply different techniques for incorporating the information from decoding a lower bit into the determination of a higher bit.

Figure 9A:
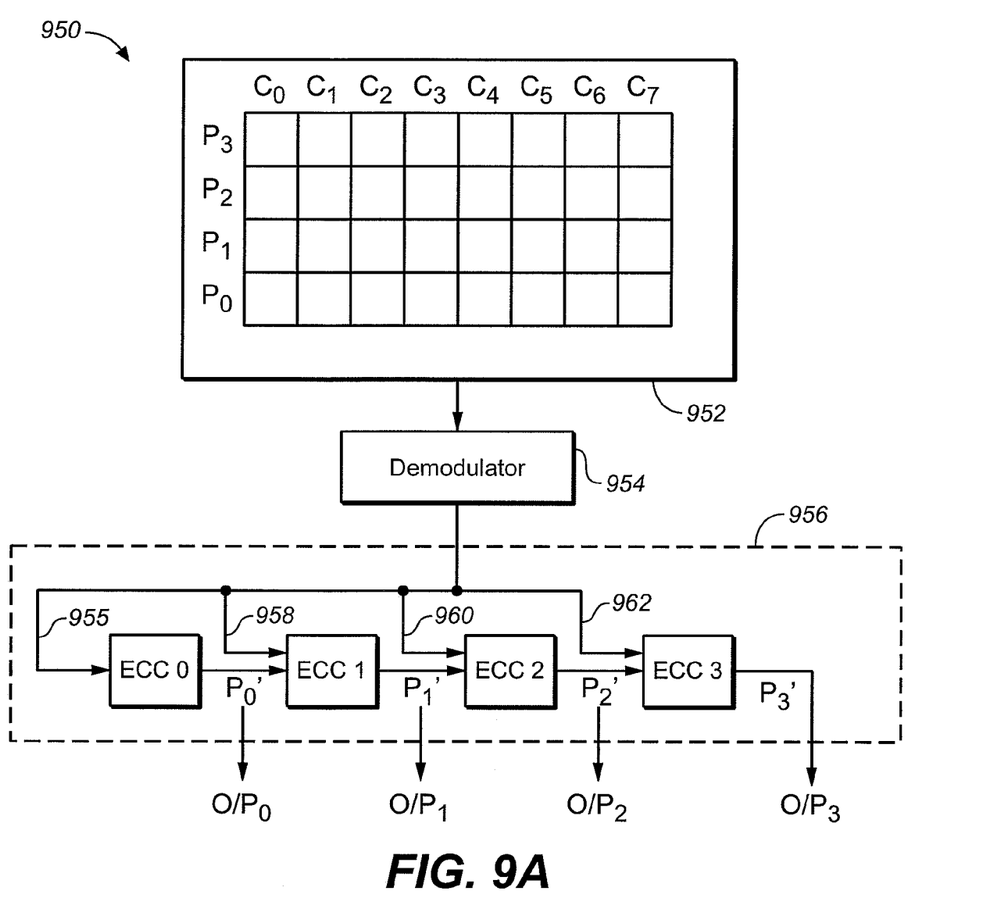
FIG. 9A shows a portion of a memory system including an ECC decoder that has four ECC modules that decode four pages of data, the output from decoding one page sent to a subsequent decoding module where it is used to decode the next page of data.

FIG. 9A shows an example of a portion of a memory system 950 that uses ECC correction of a first page to provide soft-input for ECC correction of a subsequent page. A memory array 952 includes eight memory cells C0-C7, each of which stores four bits of data, one bit from each of four pages P0-P3. Data stored in pages P0-P3 is encoded prior to storage. In particular, data in P0 is encoded so that it can be separately decoded.

A demodulator 954 is connected to the memory array and an output of the demodulator is provided as input 955 to an ECC decoder 956. The demodulator 956 may include suitable read circuits to determine the threshold voltage of individual memory cells with at least enough resolution to identify a programmed memory state. The output of the demodulator 954 is provided for a first ECC decoding module ECC0. The output of the demodulator 954 may be bits (hard-input), probability values (soft-input), threshold voltages or other indicators of memory cell states. ECC0 decodes data stored in page P0. This may be hard-input hard-output decoding or SISO decoding. Generally, SISO decoding provides better results. Module ECC0 provides corrected data P0', which may be a set of probability values or corrected bits associated with bits stored in page P0. Corrected data P0' is used to provide a first output O/P$_0$ from the ECC decoder 956 that is the decoded data from page P0. The output O/P$_0$ may be generated by performing a soft-to-hard conversion if P0' is a soft-output and also stripping any redundant data bits added as part of encoding data prior to storing data in the memory array 952.

Corrected data P0' is provided as an input to a second ECC module ECC1 that decodes data stored in page P1. Module ECC1 receives corrected data P0' generated by ECC0 and also receives an input 958 from the demodulator 954. The input 958 from the demodulator 954 may be a set of probability values or bits that are based on reading the memory array 952. The combination of the corrected P0' data and the demodulator input 958 may be considered to form a soft-input to module ECC1. For example, where ECC0 provides a hard-output that suggests a bit of page P1 is a 1, but the input 958 from the demodulator 954 suggests that the bit is a 0, these may be combined to provide either a low likelihood of either 1 or 0. Where both ECC0 and input 958 from the demodulator 954 suggest a 1, these may be combined as a high likelihood of a 1. Where probability values are provided they may be combined in a suitable manner such as by averaging probability values. ECC module ECC1 carries out decoding based on the combination of input from ECC0 and input 958 from the demodulator 954 to provide corrected data P1'. Corrected data P1' may be used to provide output O/P$_1$ (the decoded data from page P1), which is a hard-data with any redundant data bits removed. Corrected data P1' is also provided to another ECC module, ECC2.

ECC module ECC2 receives P1' and also receives input 960 from the demodulator 954 and performs ECC decoding on the combination of these inputs as before to provide corrected data P2'. Corrected data P2' is used to provide output O/P$_2$ (the decoded data from page P2), which is a hard output with redundant data bits removed. Corrected data P2' is then passed to ECC module ECC3 where it is combined with input 962 from the demodulator 954 to determine corrected data P3', which corresponds to data stored in page P3. Corrected data P3' is used to provide output O/P3 (the decoded data from page P3), which is hard-data with redundant data bits removed.

ECC modules ECC1-ECC3 may be of any suitable type and may use similar encoding schemes or different encoding schemes. ECC1 may receive either a hard-input or a soft-input and may carry out decoding using hard-input hard-output decoding, SISO decoding or other techniques. ECC modules ECC1-ECC3 receive two inputs each, either one of which may be either a soft-input or a hard-input. Even if both inputs are hard-inputs, in combination they may be considered to provide a soft-input.

In other examples, pages may be encoded and decoded together. For example, a first page and a second page may be decoded together. Subsequently, a third page and a fourth page may be read and results of decoding the first and second pages may be used in decoding the third and fourth pages.

Figure 9B:
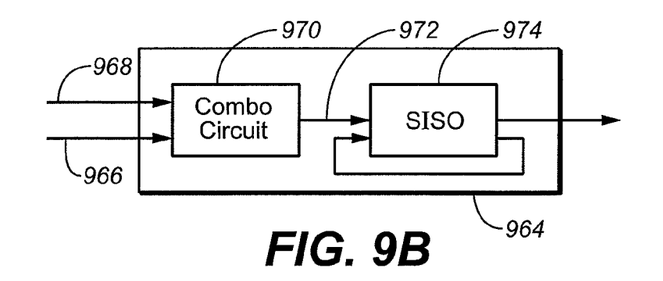
FIG. 9B shows one example of a decoding module that may be used in the memory system of FIG. 9A.

FIG. 9B shows a first example of an ECC module 964 that may be used for ECC modules ECC1-ECC3. Two inputs 966, 968 are provided to the ECC module 964, one input 968 provided by a demodulator reflecting data read from a memory array and the other input 968 provided by a previous ECC module decoding other data stored in the same memory cells. The two inputs 966, 968 are provided to a combining circuit 970 that generates a single output 972 based on the two inputs 966, 968. For example, increased margins may be provided by a previous ECC module and a threshold voltage may be provided by a demodulator. These are combined in the combination circuit 970 to provide a soft-output. Where a demodulator provides probability values, probability values from the demodulator and previous ECC module may be combined to provide a combined value that is an average of the probability values. Hard-inputs may be combined by assigning a high probability where the two hard-inputs are the same and a low probability where the two hard-inputs are different. The combining circuit 970 may use a lookup table or other suitable means to provide an output that depends on the two inputs. The soft-output 972 generated by the combining circuit is then sent to a SISO decoder 974 that performs one or more iterations to determine output probability values (or output bits if soft-to-hard conversion is performed).

Figure 9C:
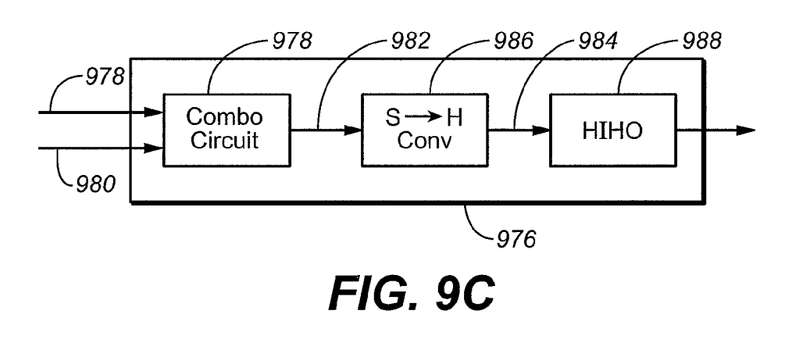
FIG. 9C shows another example of a decoding module that may be used in the memory system of FIG. 9A.

FIG. 9C shows an alternative ECC module 976 having a combination circuit 978 that combines an input 978 from a demodulator and an input 980 from another ECC module to provide a soft-output 982 as before. In this case, the soft-output 982 is then converted to a hard-output 984 by a soft-to-hard converter 986 (the most probable bit is provided as the output). The hard-output 984 is then provided to a hard-input hard-output (HIHO) decoder 988 that decodes the data to provide corrected data. Alternatively, combination and soft-to-hard conversion may be performed together, for example using a lookup table that provides hard-output values for different input values (either hard or soft).

Decoder module ECC0 receives only one input 955 (from the demodulator), which may be either a soft, or a hard input and decoder ECC0 may generate either a soft or a hard output. For example, module ECC0 may be formed similarly to decoder 429 of FIG. 5. ECC0-ECC3 may be as shown in FIG. 9B or FIG. 9C. ECC modules ECC0-ECC1 may be formed as separate circuits or may be formed as a single circuit that is configured to perform successive ECC operations. In one example, the ECC modules are formed as part of a controller ASIC.

As described above, different pages may be decoded in separate decoding steps. The results of decoding a first page are provided to help decode a second page. The results of decoding the second page may be provided to help decode a third page and so on. To enable separate decoding of pages, each page may be separately encoded. Additional information provided by decoding the first page may allow decoding of the second page to be performed using fewer redundant bits. According to one example, different numbers of ECC bits are provided for different pages. A large number of redundant bits may be provided for a first page to allow correction of a large number of errors. A smaller number of redundant bits may be provided for a second page because of the wider margins (or higher probabilities) associated with bits of the second page as a result of decoding the first page. Different encoding schemes with different degrees of redundancy may be used for different pages. Generally, the addressable unit used in a memory system is a sector. In one example, a sector is stored so that it extends over more than one page in an MLC memory. Different ECC schemes that use different numbers of redundant bits may be used for different pages of the same sector.

Figure 10:
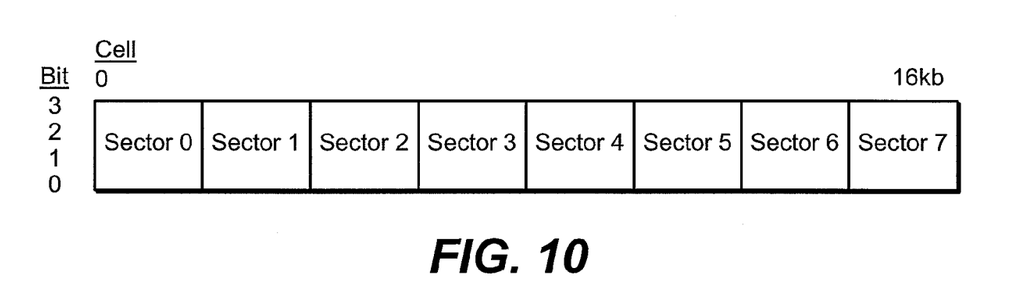
FIG. 10 shows how sectors of data may be stored in a memory array so that an individual sector is stored with bits in each of four pages.

FIG. 10 shows eight sectors (sectors 0-7) that are stored in cells so that individual cells contain four bits (bit0-bit3) of a single sector. Sectors 0-7 are programmed together as four pages corresponding to bits 0-3. Where bits are allocated to memory states as shown in FIG. 7A, it may be expected that page 0 will be read as having a large number of errors, page 1 fewer errors than page 0, page 2 fewer errors than page 1 and page 3 fewer errors than page 2. This is because of the larger margin (or probability) for higher pages. This means that more error correction may be needed for lower pages, particularly page 0. The encoding scheme used, including the amount of redundant data, may be selected accordingly. The term "page" is generally used to refer to a unit of programming in a memory array. Multiple pages may be stored in the same cells using an MLC scheme. In certain examples presented here, all the pages stored together in a group of cells are read together and individual reading of a page is not performed. Thus, the minimum unit of reading used in such a system may consist of multiple pages. It will be understood that the term "page" refers to a group of bits at the same significance across a group of cells that are programmed together, not to a group of bits that may be read together as a unit in a particular memory system.

Figure 11A:
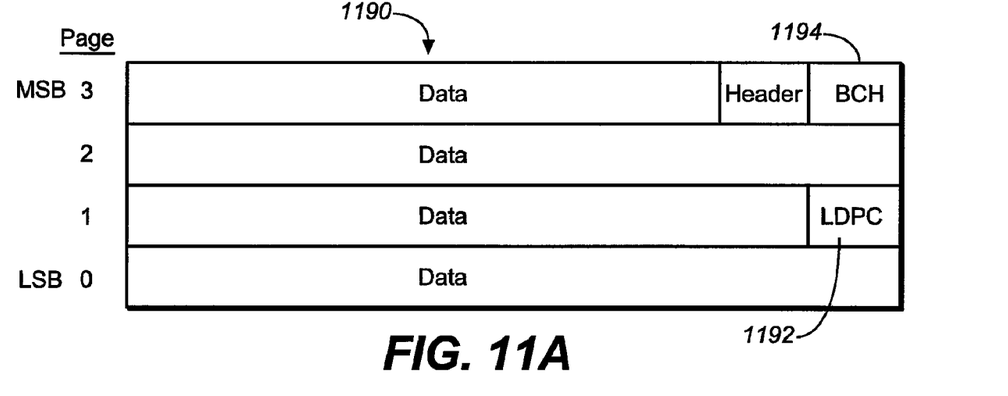
FIG. 11A shows an example of a sector that is stored in four pages, two pages being encoded with LDPC encoding and the other two pages being encoded with BCH encoding.

FIG. 11A shows an example of a sector 1190 that extends across four pages (pages 0-3) and includes two different encoding schemes. Data in page 0 and page 1 is encoded using an LDPC encoding scheme, which generates redundant data bits 1192. This data may be decoded using SISO decoding, which allows correction of a large number of errors. Data in pages 2 and 3 are not encoded with an LDPC code. However, data of pages 2-3 are encoded with a BCH code, which provides redundant data bits 1194. Data of pages 0-1 may also be encoded using BCH coding, or BCH coding may be limited to pages 2-3. Where BCH coding covers pages 0-1, data of pages 0-4 are first encoded according to BCH encoding, then pages 0-1 are further encoded according to LDPC encoding. Later, data in pages 0-1 are first decoded using LDPC, then pages 0-4 are decoded using BCH.

Figure 11B:
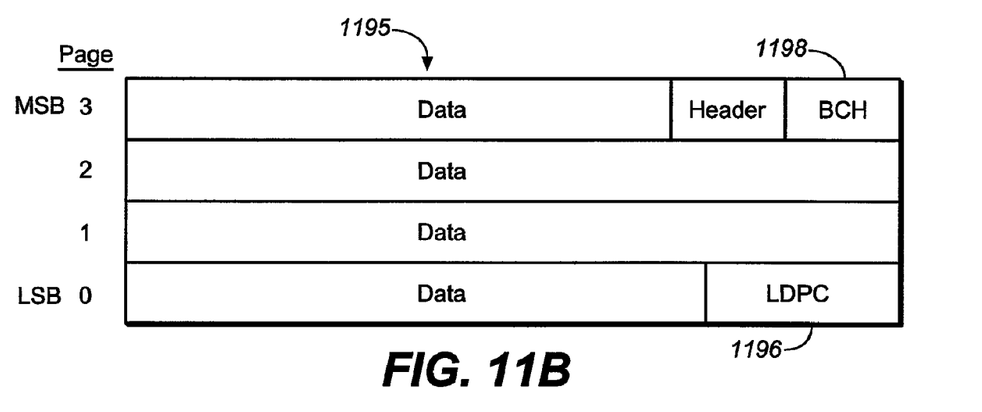
FIG. 11B shows an example of a sector that is stored in four pages, one page encoded with LDPC encoding and the other three pages being encoded with BCH encoding.

FIG. 11B shows another example of a sector 1195 where only page 0 is encoded according to an LDPC code, so only page 0 contains redundant LDPC generated bits 1196. Higher pages 1-3 are encoded using a BCH code that uses BCH generated redundant bits 1198. BCH encoding may extend to cover page 0 in addition to pages 1-3, or may cover only pages 1- 3. Thus, page 0 is encoded according to an encoding scheme that is not used for other pages.

Figure 11C:
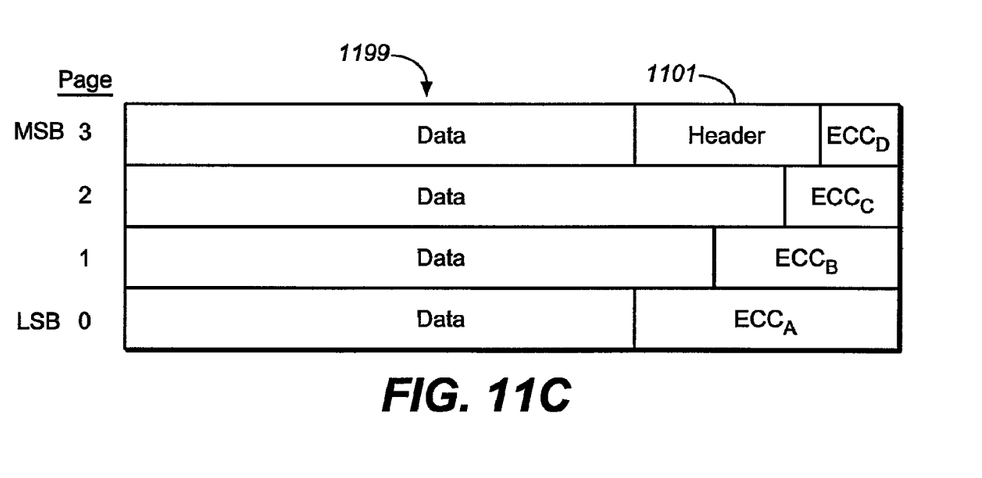
FIG. 11C shows an example of a sector that is stored in four pages, each page encoded to have a different amount of redundant data.

FIG. 11C shows another example of a sector 1199 where different encoding schemes are used for each page 0-3. Redundant data $ECC_A$ is generated for page 0 according to a first encoding scheme, redundant data $ECC_B$ is generated for page 1 according to a second encoding scheme, redundant data $ECC_C$ is generated for page 2 according to a third encoding scheme and redundant data $ECC_D$ is generated for page 3 according to a fourth encoding scheme. Page 0 has more redundant data $ECC_A$ than other pages so that page 0 is decoded first and used to provide information for decoding other pages. Encoding schemes for different pages may be of the same type (e.g. all LDPC schemes) or different types (e.g. LDPC and BCH schemes). Schemes of the same type may be considered different schemes where they use different amounts of redundant data. In some cases, encoding schemes of higher pages may also cover lower pages. Thus, ECCB may cover pages 0 and 1 so that these pages are decoded together according to the second encoding scheme. ECCC may cover pages 0-2 so that these pages are decoded together according to the third encoding scheme etc. Such pages must be encoded together also.

While the examples of FIGS. 11A-11C show redundant data being separate from other data, in other schemes, unencoded data may be mapped to encoded data in more complex ways as previously described. The number of extra bits used for encoded data compared with unencoded data may be considered the number of redundant bits even where there are no separately identifiable redundant bits. Header information 1101 is shown in page 3 of the above examples. However, header information may be provided in other locations also.

Figure 12:
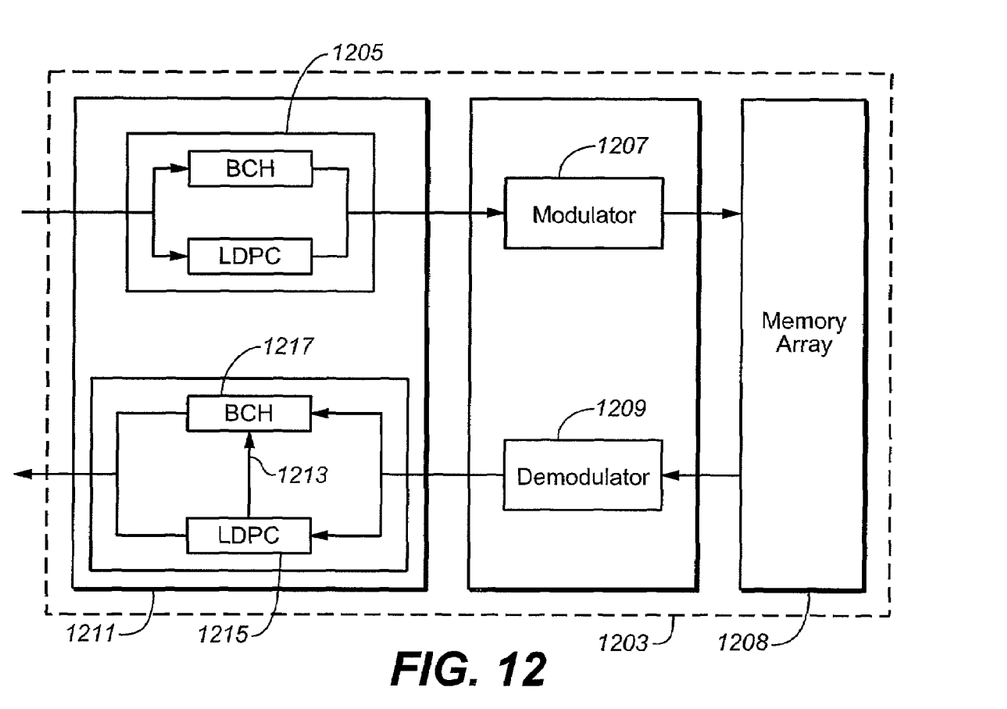
FIG. 12 shows a memory system having an encoder that encodes some data according go a BCH code and encodes other data with an LDPC code, the memory system having a decoder that decodes LDPC encoded data and provides an output from the LDPC decoding that is used in decoding BCH encoded data.

FIG. 12 shows an example of a memory system 1203 that uses different encoding schemes for different pages. In particular, the memory system shows an encoder 1205 that applies LDPC encoding to some data and applies BCH encoding to other data (in other examples, BCH encoding applies to all data and LDPC encoding applies only to some data). The encoded data is then sent to a modulator 1207 that stores the data in a memory array 1208. In particular, modulator 1207 stores LDPC encoded data in a first page and stores BCH encoded data in higher pages in the same memory cells. The modulator maps bits of data to memory states according to a suitable scheme such as that of FIG. 7A, so that a first bit (a bit in the first page) alternates from one memory state to the next.

Data is read from the memory array by a demodulator 1209 and is provided to a decoder 1211 that carries out LDPC decoding on data from page 0 and carries out BCH decoding on data from other pages. An output 1213 from LDPC decoder 1215 is provided to the BCH decoder 1217 so that the BCH decoder 1217 can use correction by the LDPC decoder 1215 to help in performing BCH decoding. There may also be some output from one BCH decoding operation to a subsequent BCH decoding operation.

In some cases, output from a BCH decoder is also fed back to LDPC decoder to be used in LDPC decoding. For example, LDPC decoding may be iterative decoding that performs a number of iterations and then provides an output to the BCH decoder. If the BCH decoder cannot correct the data provided, it may return a signal to the LDPC decoder to indicate that more iterations should be performed.

Figure 13:
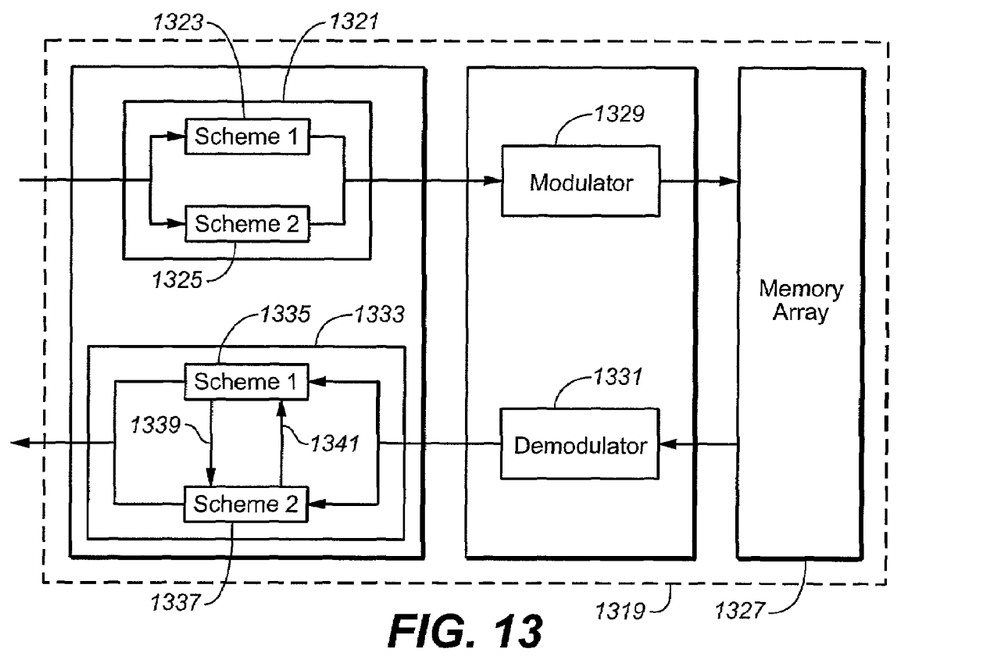
FIG. 13 shows another memory system that encodes different portions of data that are stored in the same memory cells according to two different encoding schemes before storing the data in memory, the data is decoded using two decoders for the two schemes, and an output from each decoder is provided to the other decoder.

FIG. 13 shows a memory system 1319 including an encoder 1321 that encodes first data in a first encoder 1323 according to a first encoding scheme and encodes second data in a second encoder 1325 according to a second encoding scheme, the first and second data programmed to shared cells in memory array 1327 by a modulator 1329. The data is read from memory array 1327 by a demodulator 1331 and is decoded by decoder 1333. Read data corresponding to first data is decoded in a first decoder 1335 according to the first scheme and read data corresponding to the second data is decoded in a second decoder 1337 according to the second scheme. An output 1339 from first decoder 1335 is provided to second decoder 1337 so that results of decoding first data may be used in decoding second data. Also, an output 1341 from second decoder 1337 is provided to first decoder 1335 so that results of decoding second data may be used in decoding first data. Thus, first decoder 1335 and second decoder 1337 interact to jointly decode data. First and second encoding schemes may both be LDPC schemes, with different amounts of redundant data in one example. In another example, the first encoding scheme is an LDPC scheme and the second encoding scheme is a BCH scheme.

The various examples above refer to flash memory. However, various other nonvolatile memories are currently in use and the techniques described here may be applied to any suitable nonvolatile memory systems. Such memory systems may include, but are not limited to, memory systems based on ferroelectric storage (FRAM or FeRAM), memory systems based on magnetoresistive storage (MRAM), and memories based on phase change (PRAM or "OUM" for "Ovonic Unified Memory").

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A nonvolatile semiconductor memory system comprising:
   a memory array that includes a plurality of memory cells;
   an ECC encoder for encoding data of a first page according to a first encoding scheme to obtain a first plurality of encoded data bits and not encoding data that includes a second plurality of bits of a second page according to the first encoding scheme and for storing the first and second plurality of bits in the plurality of cells, wherein each of the plurality of memory cells contains at least one of the first plurality of encoded bits and at least one of the second plurality of bits.

2. The nonvolatile semiconductor memory system of claim 1 wherein the ECC encoder is further configured to encode data of the second page according to a second encoding scheme.

3. The nonvolatile semiconductor memory system of claim 2 wherein the first encoding scheme uses more redundant bits than the second encoding scheme.

4. The nonvolatile semiconductor memory system of claim 1 further comprising:
   a reading circuit for reading data from the plurality of memory cells; and
   an ECC decoder for decoding the read data.

5. The nonvolatile semiconductor memory system of claim 4 wherein the ECC decoder is further configured to receive the read data as soft-input, decode data of the first page first and use an output of the decoding of the first page, with the read data, to decode data of the second page.

6. The nonvolatile semiconductor memory system of claim 1 wherein the first page includes data of a sector and the second page includes data of the sector.

7. A nonvolatile semiconductor memory system, comprising:
   a memory array that includes a plurality of memory cells that individually hold a first bit of data of a first page and a second bit of data of a second page; and
   an ECC encoder that encodes data of the first page according to a first encoding scheme prior to storage in the plurality of cells and does not encode data of the second page according to the first encoding scheme prior to storage in the plurality of cells,
   wherein the first encoding scheme is a Low Density Parity Check (LDPC) scheme.

8. A nonvolatile semiconductor memory system comprising:
   a flash memory array for storing data in a plurality of cells, an individual cell storing at least a first data bit of a first page of data and a second data bit of a second page of data; and
   an ECC decoding system for first decoding the first page of data according to a first decoding scheme and subsequently using results of the decoding of the first page of data to decode the second page of data according to a second decoding scheme.

9. The flash memory system of claim 8 wherein the ECC decoding system includes a soft-input soft-output decoder which uses the results of the decoding of the first page along with data read from the plurality of cells as a soft-input.

10. The flash memory of claim 8 wherein data stored in the first page is encoded according to a first encoding scheme and data stored in the second page is not encoded according to the first encoding scheme.

11. The flash memory of claim 10 wherein the data stored in the second page is encoded according to a second encoding scheme.

12. The flash memory of claim 8 further comprising a reading circuit that reads the plurality of cells to provide probability values that are sent to the ECC decoding system.

13. A flash memory system comprising:
   a flash memory array that stores at least a first page of data and a second page of data in a plurality of cells, each of the plurality of cells containing a first bit of the first page and a second bit of the second page;
   an encoder that encodes data of the first page according to a first encoding scheme and encodes data of the second page according to a second encoding scheme;
   a reading circuit that reads the plurality of cells and that provides probability values individually associated with bits stored in the plurality of cells; and
   a soft-input soft-output ECC decoder that receives probability values from the reading circuit to decode the first page of data, and uses the results of the decoding of the first page of data to decode the second page of data.

14. The flash memory system of claim 13 wherein the first encoding scheme is a Low Density Parity Check (LDPC) scheme.

15. The flash memory system of claim 13 wherein the second encoding scheme uses fewer redundant bits than the first encoding scheme.

16. The flash memory system of claim 13 wherein the plurality of cells contain at least a third page.

17. The flash memory system of claim 13 wherein a single host-addressable sector extends over the first and second page.

18. The flash memory of claim 13 wherein the encoder encodes the data of the first page according to the second encoding scheme prior to encoding the data of the first page according to the first encoding scheme.

19. The flash memory of claim 18 wherein the decoder decodes the second page of data and the first page of data together using the second encoding scheme.

20. The flash memory system of claim 13 wherein the soft-input soft-output ECC decoder uses the results of the decoding of the second page of data to decode the first page of data.

* * * * *